United States Patent
Song et al.

(10) Patent No.: US 10,418,571 B2
(45) Date of Patent: Sep. 17, 2019

(54) LIGHTING APPARATUS USING ORGANIC LIGHT EMITTING DEVICE AND METHOD OF FABRICATING THEREOF

(71) Applicant: LG DISPLAY CO., LTD., Seoul (KR)

(72) Inventors: Taejoon Song, Paju-si (KR); Namkook Kim, Suwon-si (KR); Shinbok Lee, Seoul (KR); Soonsung Yoo, Goyang-si (KR); Hwankeon Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/709,103

(22) Filed: Sep. 19, 2017

(65) Prior Publication Data

US 2018/0190948 A1    Jul. 5, 2018

(30) Foreign Application Priority Data

Dec. 29, 2016 (KR) .......................... 10-2016-0182829

(51) Int. Cl.
*H01L 29/18* (2006.01)
*H01L 21/00* (2006.01)
(Continued)

(52) U.S. Cl.
CPC ...... *H01L 51/0097* (2013.01); *H01L 51/5203* (2013.01); *H01L 51/5212* (2013.01);
(Continued)

(58) Field of Classification Search
CPC .......................... H01L 51/5212; H01L 52/5228
(Continued)

(56) References Cited

U.S. PATENT DOCUMENTS 8,823,030 B2 * 9/2014 Jinbo ................... H01L 51/5265
257/98
9,508,959 B2 * 11/2016 Washio ............... H01L 51/5243
(Continued)

FOREIGN PATENT DOCUMENTS

CN    101523634 A    9/2009
CN    103959504 A    7/2014
(Continued)

OTHER PUBLICATIONS

Chinese Office Action, dated Mar. 28, 2019, for Chinese Application No. 201711034454.0, 19 pages. (with English Machine Translation).

*Primary Examiner* — Calvin Lee
(74) *Attorney, Agent, or Firm* — Seed IP Law Group LLP

(57) ABSTRACT

A lighting apparatus of the present disclosure may transport a film formed with a plurality of lighting apparatuses between rolls, and place a mask on an entire surface of the film to deposit an organic light emitting material in a state in which a part of the film is blocked to form an organic light emitting layer, and then deposit a metal layer by the same mask to form a second electrode, wherein the organic light emitting layer and the second electrode are not formed in a region where a pad is formed by the mask to open the pad and connect an external signal source thereto. The first electrode may be connected to a first pad and the second electrode may be connected to a second pad to apply a voltage, wherein a part of the organic light emitting layer is laser-etched to form a contact portion, and the second electrode is electrically connected to the second pad.

12 Claims, 13 Drawing Sheets

(51) Int. Cl.
  *H01L 51/00* (2006.01)
  *H01L 51/52* (2006.01)
(52) U.S. Cl.
  CPC .............. *H01L 2251/5338* (2013.01); *H01L 2251/5361* (2013.01); *Y02E 10/549* (2013.01)
(58) Field of Classification Search
  USPC ............................. 438/28, 34; 257/83, 88
  See application file for complete search history.

(56) References Cited

U.S. PATENT DOCUMENTS

| | | |
|---|---|---|
| 2010/0295443 A1 | 11/2010 | Roberts et al. |
| 2014/0306210 A1 | 10/2014 | Lee et al. |
| 2016/0238234 A1 | 8/2016 | Diekmann et al. |
| 2018/0190947 A1* | 7/2018 | Song .................. H01L 51/5203 |

FOREIGN PATENT DOCUMENTS

| | | |
|---|---|---|
| CN | 104982092 A | 10/2015 |
| WO | 2012/052886 A2 | 4/2012 |
| WO | 2012/133715 A1 | 10/2012 |
| WO | 2013/089231 A1 | 6/2013 |
| WO | 2014/122938 A1 | 8/2014 |

\* cited by examiner

ND METHOD
LIGHTING APPARATUS USING ORGANIC LIGHT EMITTING DEVICE AND METHOD OF FABRICATING THEREOF

CROSS-REFERENCE TO RELATED APPLICATIONS

This application claims priority from and the benefit of Korean Patent Application No. 10-2016-0182829, filed on Dec. 29, 2016, which is hereby incorporated by reference in its entirety.

BACKGROUND

Technical Field

The present disclosure relates to a lighting apparatus using an organic light emitting device with a simplified fabrication process, and a fabrication method thereof.

Description of the Related Art

In recent years, a fluorescent lamp or an incandescent lamp has been mainly used as a lighting apparatus. Among them, the incandescent lamp has a good color rendering index but has a low energy efficiency, and the fluorescent lamp has a good efficiency, but has a low color rendering index and contains mercury and thus has an environmental problem.

In order to solve such a problem of the lighting apparatus in the related art, in recent years, a light emitting diode (LED) has been proposed as a lighting apparatus. The light emitting diode is composed of an inorganic light emitting material, and has the highest luminous efficiency in a blue wavelength band, but has a lower luminous efficiency as it goes toward a red and a green wavelength band, which is a color having the highest visual sensitivity. Therefore, there is a problem in that the luminous efficiency is reduced when white light with a combination of a red light emitting diode, a green light emitting diode, and a blue light emitting diode is emitted. Furthermore, since the width of each emission peak is narrow when a red light emitting diode, a green light emitting diode, and a blue light emitting diode are used, there is also a problem in that the color rendering property deteriorates.

In order to solve such a problem(s), a lighting apparatus for combining a blue light emitting diode with a yellow colored phosphor instead of combining a red light emitting diode, a green light emitting diode and a blue light emitting diode to output white light has been proposed. The reason why the light emitting diode having such a structure is proposed is that a method of using only a blue light emitting diode having a higher luminous efficiency and using a fluorescent material that receives blue light to emit yellow light for the remaining colors is more efficient than that of using a green light emitting diode having a low luminous efficiency.

However, even in case of a lighting apparatus of combining a blue light emitting diode with a yellow colored phosphor to output white light, the fluorescent material itself that emits yellow light has a poor luminous efficiency, and thus there is a limit in enhancing the luminous efficiency of the lighting apparatus.

BRIEF SUMMARY

The present disclosure is developed to solve the aforementioned problem(s) and an object of the present disclosure is to provide a lighting apparatus that can be fabricated by depositing an organic light emitting layer and a metal layer on a substrate using only one open mask, and a fabrication method thereof.

According to the present disclosure, a lighting apparatus may be fabricated on a film being transported in a roll fabrication apparatus, thereby allowing a continuous and rapid fabrication of a lighting apparatus. In addition, according to the present disclosure, the deposition of an organic light emitting material and a metal may be carried out by a single mask, thereby facilitating facility usage and cost reduction and simplifying fabrication processes.

To simplify the fabrication processes, in this disclosure, a film formed with a plurality of lighting apparatuses is transported between rolls, and a mask is disposed on an entire surface of the film to deposit an organic light emitting material in a state that a partial region of the film is blocked, and then a metal layer is deposited by the same mask to form a second electrode. Here, the organic light emitting layer and the second electrode may not be formed in a region where a pad is formed by the mask, thereby leaving open the pad to be connected to an external signal source.

A first electrode, an organic light emitting layer, and a second electrode are formed on a lighting portion of the lighting apparatus to form an organic light emitting device, and a first pad is connected to the first electrode and a second pad is connected to the second electrode to apply a voltage thereto. Here, a portion of the organic light emitting layer is laser-etched to form a contact portion, and the second electrode is electrically connected to the second pad through the contact portion.

According to the present disclosure, the process may be carried out on a film transported between rolls by a roll fabrication apparatus, thereby allowing a rapid and continuous fabrication process of a lighting apparatus. In addition, according to the present disclosure, a lighting apparatus may be fabricated by a single mask, thereby reducing the cost of facilities and decreasing the installation space of facilities.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION

Hereinafter, the present disclosure will be described in detail with reference to the accompanying drawings.

The present disclosure provides a lighting apparatus including an organic light emitting device made of an organic material rather than a lighting apparatus including an inorganic light emitting device made of an inorganic material.

An organic light emitting device made of an organic light emitting material has a relatively good luminous efficiency in green and red colors as compared with an inorganic light emitting device. In addition, an organic light emitting device has a relatively larger width in blue, red and green emission peaks as compared with an inorganic light emitting device, and thus it has an advantage in that the color rendering property thereof is improved and the light of the light emitting apparatus is more similar to the sunlight.

According to the present disclosure, the lighting apparatus may be fabricated by a roll-to-roll process due to a roll fabrication apparatus, and the process may be continuously carried out, thereby allowing a rapid fabrication of the lighting apparatus. In particular, according to the present disclosure, an organic light emitting layer, which is a part of the organic light emitting device of the lighting apparatus, and an electrode thereon may be formed using a single mask, thereby minimizing the usage of the expensive mask as well as reducing fabrication cost.

Figure 1:
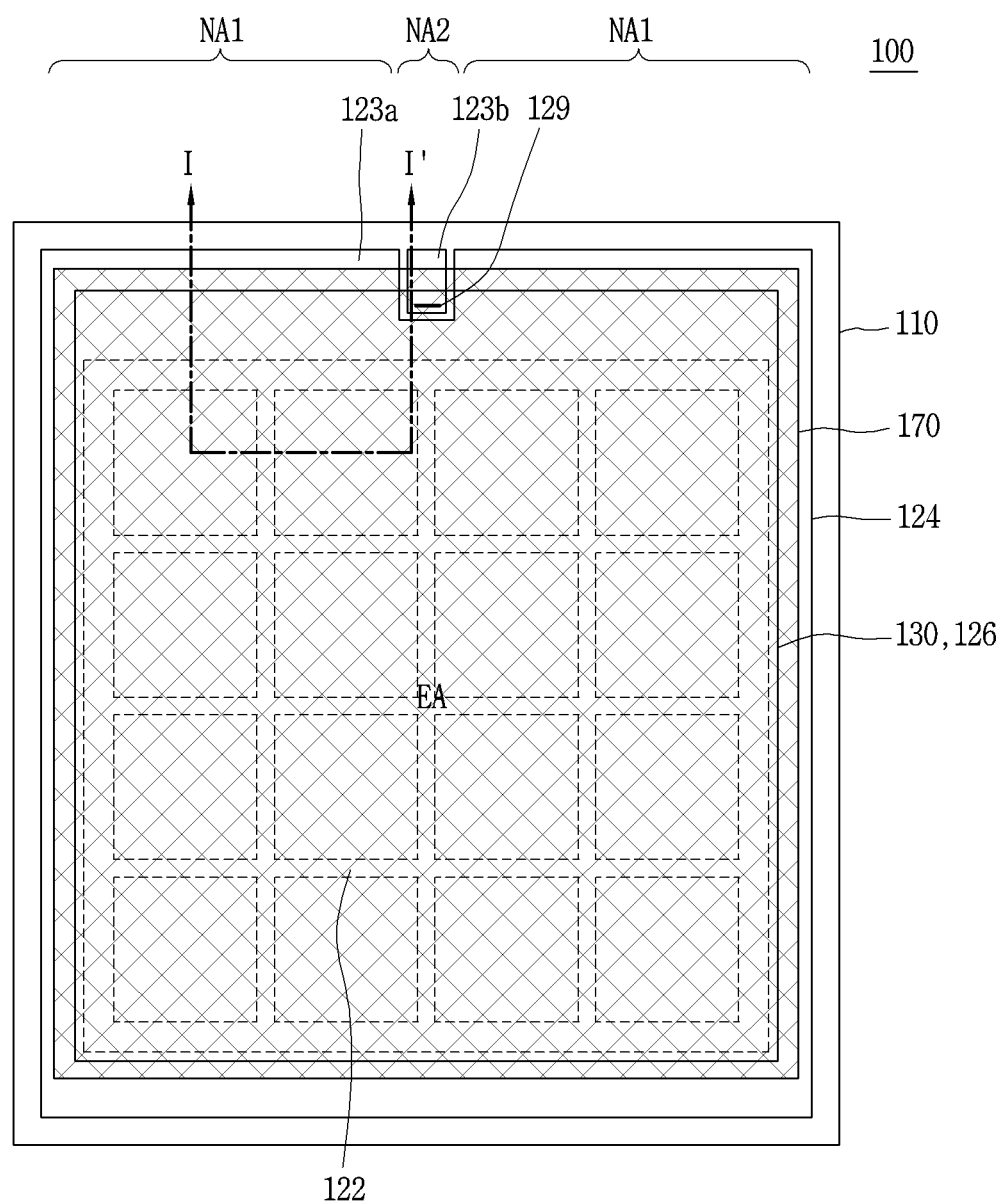
FIG. 1 is a plan view illustrating a lighting apparatus according to a first embodiment of the present disclosure.

FIG. 1 is a view illustrating the structure of a lighting apparatus using an organic light emitting diode according to the present disclosure. Here, for example, the lighting apparatus according to the present disclosure is a flexible lighting apparatus capable of being bent.

As illustrated in FIG. 1, the lighting apparatus 100 according to the present disclosure is a surface emitting lighting apparatus, which includes a lighting portion (EA) that emits actual light to output the light to the outside, and outer portions (NA1, NA2) at the outside thereof. A first electrode 124 and a second electrode 126 are disposed over an entire surface of the first substrate 110, and an organic light emitting layer 130 is formed between the first electrode 124 and the second electrode 126 to form an organic light emitting device. According to the lighting apparatus 100 having such a structure, as a signal is applied to the first electrode 124 and the second electrode 126 of the organic light emitting device, the organic light emitting layer 130 emits light over the entire substrate 110.

A matrix-shaped auxiliary electrode 122 is disposed in a partial region of the lighting portion (EA) and the outer portions (NA1, NA2). The auxiliary electrode 122 is made of a metal having a high conductivity in such a manner that a uniform voltage is applied to the first electrode 124 of the entire lighting portion (EA) to allow emission having a uniform luminance over the large-area lighting apparatus 100.

The organic light emitting layer 130 is formed of an organic light emitting material that outputs white light. For example, the organic light emitting layer 130 may include a blue organic light emitting layer, a red organic light emitting layer and a green organic light emitting layer or may have a tandem structure including a blue light emitting layer and a yellow-green light emitting layer. However, the organic light emitting layer 130 of the present disclosure is not limited to any of the above structure(s), but various structures may be applied thereto.

In addition, the present disclosure may include an electron injection layer and a hole injection layer for injecting electrons and holes respectively into the organic light emitting layer 130 of the present disclosure, an electron transport layer and a hole transport layer for transporting the injected electrons and holes respectively to the organic light emitting layer, and a charge generation layer that generates charges such as electrons and holes.

A first pad 123a is provided at an upper side the first outer portion (NA1) of the first substrate 110, and a second pad 123b and a contact portion 129 for electrically connecting to the second electrode 126 are disposed on the second outer portion (NA2). The first pad 123a and the second pad 123b are connected to an external signal source to apply a voltage to the first electrode and the second electrode.

The first pad 123a is integrally formed with the first electrode 124, and the second pad 123b is formed of the same material as the first electrode 124 at the same layer, but the second pad 123b is separated from the first pad 123a and the first electrode 124 by a predetermined distance and electrically insulated therefrom.

Though will be described later, the organic light emitting layer 130 and the second electrode 126 are formed using the same mask, and thus the organic light emitting layer 130 and the second electrode 126 are formed on the first substrate 110 in the same area. Therefore, the organic light emitting layer 130 may be disposed between the second pad 123b and the second electrode 126 formed integrally with the first electrode 124, and thus the second electrode 126 is unable to be physically in contact with the second pad 123b by the organic light emitting layer 130.

The contact portion 129 may allow the second electrode 126 to be physically connected to the second pad 123b by removing a portion of the organic light emitting layer 130 and forming the second electrode 126 within the contact portion 129. In other words, the contact portion 129 may be a contact hole formed on the organic light emitting layer 130 to expose the second pad 123b to the outside, and may be formed in various shapes and sizes such as a circular shape/hole shape, a rectangular shape, or a band shape.

Figure 2:
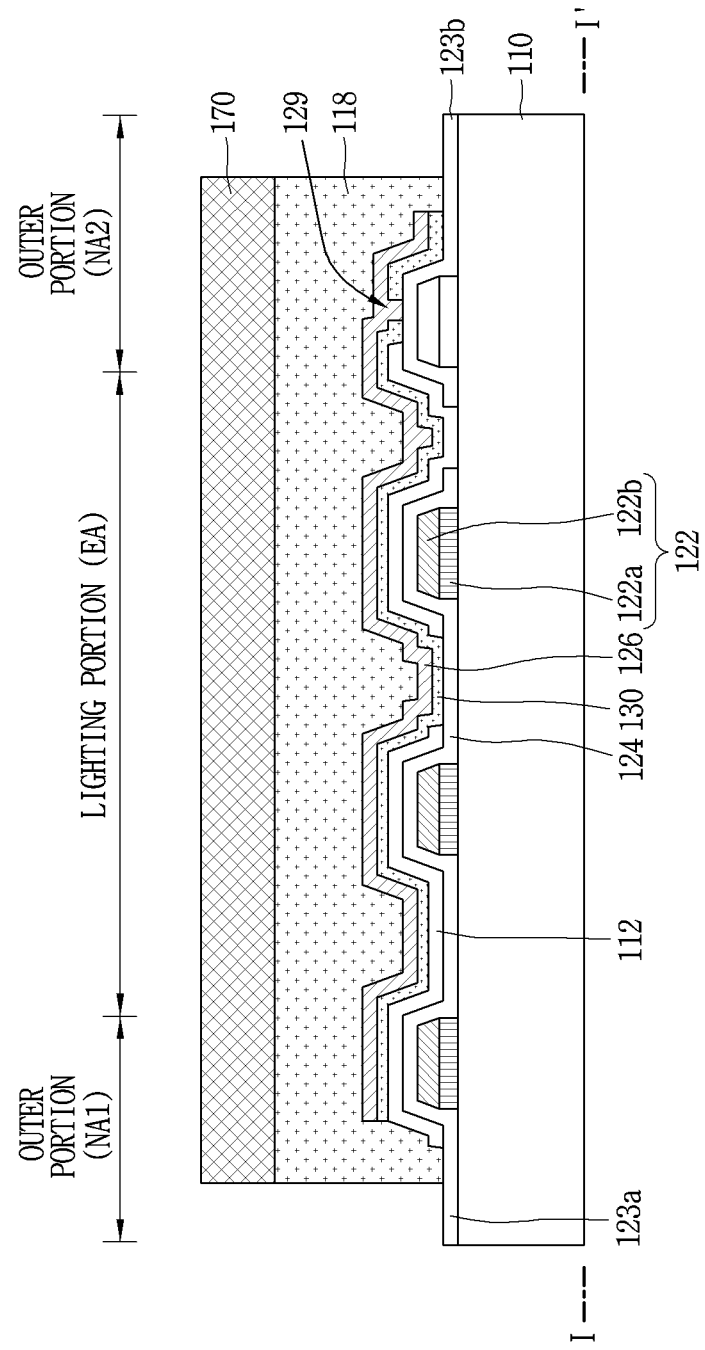
FIG. 2 is a cross-sectional view taken along line I-I' in FIG. 1.

FIG. 2 is a cross-sectional view taken along line I-I' in FIG. 1, and the lighting apparatus 100 according to a first embodiment of the present disclosure will be described in more detail with reference thereto. In the following description, the lighting apparatus of the present disclosure will be described as a flexible lighting apparatus having flexibility, but the present disclosure may be applicable not only to a flexible lighting apparatus of the present disclosure but also to a typical non-flexible lighting apparatus.

As illustrated in FIG. 2, the lighting apparatus 100 of the present embodiment may include a lighting portion (EA) that actually emits light, and outer portions (NA1, NA2) arranged along an outer circumference of the lighting portion (EA).

The first electrode 124 is disposed on the first substrate 110 made of a flexible soft transparent material such as plastic or a transparent material such as glass. Here, when a flexible material such as plastic is used for the first substrate 110, it may be possible to perform roll-to-roll processes using a roll, thereby allowing a rapid fabrication of the lighting apparatus 100. However, the present disclosure is not limited to a structure formed of a soft material such as plastic, but may also be formed of a non-flexible material such as glass. When the first substrate 110 is formed of glass as described above, it may be possible to fabricate the lighting apparatus 100 with a process of a general sheet method other than a process using a roll.

The first electrode 124 is disposed on the lighting portion (EA) and the outer portions (NA1, NA2) and formed of a transparent conductive material having a good conductivity and a high work function. For example, according to the present disclosure, the first electrode 124 may be formed of indium tin oxide (ITO), indium zinc oxide (IZO), a tin oxide based and a zinc oxide based transparent conductive material or the like, and a transparent conductive polymer may also be used for the first electrode 124.

Furthermore, the first pad 123a and the second pad 123b are disposed on the first outer portion (NA1) and the second outer portion (NA2) of the first substrate 110, respectively. The first pad 123a and the second pad 123b are formed of the same material by the same process as the first electrode 124. The first electrode 124 is extended from the first pad 123a and thus the first pad 123a is formed integrally with the first electrode 124, but the second pad 123b is spaced apart from the first electrode 124 by a predetermined distance.

The auxiliary electrode 122 is disposed on the lighting portion (EA) and the outer portions (NA1, NA2) of the first substrate 110, and electrically connected to the first electrode 124. The first electrode 124 has an advantage in that it is formed of a transparent conductive material to transmit light emitted therefrom, but also has a disadvantage in that an electrical resistance thereof is much higher than that of a metal. Accordingly, when the large-area lighting apparatus 100 is fabricated, the distribution of voltages applied to a wide lighting area becomes non-uniform due to a large resistance of the transparent conductive material, and such a non-uniform voltage distribution does not allow light emission having a uniform luminance on the large-area lighting apparatus 100.

The auxiliary electrode 122 is disposed in a matrix shape with a small width, a mesh shape, a hexagonal shape, an octagonal shape, a circular shape, or the like over the entire lighting portion (EA) to uniformly apply a voltage to the first electrode 124 of the entire lighting apparatus 100, thereby allowing light emission having a uniform luminance on the large-area lighting apparatus 100.

On the drawing, the auxiliary electrode 122 is shown as disposed below the first electrode 124, but the auxiliary electrode 122 may also be disposed above the first electrode 124. The auxiliary electrode 122 is formed of a metal having a good conductivity such as Al, Au, Cu, Ti, W, Mo or an alloy thereof. On the drawing, the auxiliary electrode 122 may be formed with a double layer structure, but the auxiliary electrode 122 may also be formed with a single layer.

A protective layer 112 is deposited on the lighting portion (EA) and the outer portions (NA1, NA2) of the first substrate 110. Here, the protective layer 112 disposed on the lighting portion (EA) is configured to cover the auxiliary electrode 122 and the first electrode 124 thereon, and the protective layer 112 is not disposed on a light emitting area from which light is actually emitted. Furthermore, the protective layer 112 of the lighting portion (EA) is formed to surround the auxiliary electrode 122 so as to reduce a stepped portion due to the auxiliary electrode 122, and thus various layers to be formed thereafter will be stably formed without being disconnected.

The protective layer 112 is formed of an inorganic layer such as SiOx or SiNx. However, the protective layer 112 may also be formed of an organic layer such as photoacryl or a plurality of layers having an inorganic layer and an organic layer.

The organic light emitting layer 130 and the second electrode 126 are disposed in a partial region of the lighting portion (EA) and the outer portions (NA1, NA2).

The organic light emitting layer 130 may be formed of a red light emitting layer, a blue light emitting layer, and a green light emitting layer or configured with a tandem structure including a blue light emitting layer and a yellow-green light emitting layer as a white organic light emitting layer. Furthermore, the organic light emitting layer 130 may include an electron injection layer and a hole injection layer for injecting electrons and holes respectively into the organic light emitting layer, an electron transport layer and a hole transport layer for transporting the injected electrons and holes respectively to the organic light emitting layer, and a charge generation layer that generates charges such as electrons and holes. The second electrode 126 may be formed of a metal such as Ca, Ba, Mg, Al or Ag.

The first electrode 124, the organic light emitting layer 130, and the second electrode 126 of the lighting portion (EA) form an organic light emitting device. When the first electrode 124 is an anode of an organic light emitting device and the second electrode 126 is a cathode thereof, and a voltage is applied to the first electrode 124 and the second electrode 126, electrons are injected from the second electrode 126 into the organic light emitting layer 130 and holes are injected from the first electrode 124 into the organic light emitting layer 130 to generate excitons within the organic light emitting layer 130, and as excitons decay, light corresponding to an energy difference between LUMO (Lowest Unoccupied Molecular Orbital) and HOMO (Highest Occupied Molecular Orbital) of the light emitting layer is generated and emitted in a downward direction (toward the substrate 110 on the drawing).

The protective layer 112 is disposed on the auxiliary electrode 122 of the lighting portion (EA), and the organic light emitting layer 130 on the auxiliary electrode 122 is not directly in contact with the first electrode 124, and thus the organic light emitting device is not formed on the auxiliary electrode 122. In other words, the organic light emitting device within the lighting portion (EA) is formed only within the auxiliary electrode 122 in a matrix shape, for example.

According to the present disclosure, the organic light emitting layer 130 and the second electrode 126 are formed in the same area since the lighting portion (EA) and the outer portions (NA1, NA2) are deposited using the same mask. Accordingly, the organic light emitting layer 130 is disposed between the second electrode 126 and the second pad 123b, and thus the second electrode 126 is not electrically connected to the second pad 123b.

A partial region of the organic light emitting layer 130 on the second pad 123b of the second outer portion (NA2) is removed to form the contact portion 129, and thus the second electrode 126 is electrically connected to the second pad 123b through the contact portion 129.

The contact portion 129 is an open region from which a partial region of the organic light emitting layer 130 is removed, namely, a contact hole. Here, the contact portion 129 may be formed in various shapes, and in particular, according to an example of the present disclosure, the organic light emitting layer 130 may be removed by a laser to form the contact portion 129.

An adhesive 118 is coated on the first substrate 110 having the organic light emitting device and a second substrate 170 is disposed thereon, and the second substrate 170 is adhered by the adhesive 118 to seal the lighting apparatus 100. The adhesive 118 may be a photocurable adhesive or thermosetting adhesive. The second substrate 170 may be formed of various materials. The second substrate 170 is a substrate for preventing moisture or air from penetrating from the outside, and any material may be used as long as it can perform such a function. For example, the second substrate 170 may be formed of a polymer such as PET (polyethyleneterephtalate) or may be formed of a thin metal foil such as aluminum. In case of using a sheet fabrication apparatus other than a roll fabrication apparatus, a non-flexible material such as glass may be used.

Furthermore, though not shown in the drawing, a protective layer formed of an organic layer and/or an inorganic layer and a sealant formed of an epoxy compound, an acrylate compound or an acrylic compound may be provided on the second electrode 126.

Furthermore, though not shown in the drawing, a flexible circuit film such as an FPC (Flexible Printed Circuit) is adhered to the first pad 123a and the second pad 123b, respectively, and the first pad 123a and the second pad 123b are respectively connected to an external signal source to apply a signal to the first electrode 124 and the second electrode 126.

As described above, according to the present disclosure, the organic light emitting layer 130 and the second electrode 126 are sequentially deposited in the same region, and the second electrode 126 and the organic light emitting layer 130 insulated by interposing the organic light emitting layer 130 therebetween are electrically connected to each other through the contact portions 129 formed on the organic light emitting layer 130.

Hereinafter, a method of fabricating the lighting apparatus 100 according to the present disclosure will be described with reference to the accompanying drawings.

Figure 3:
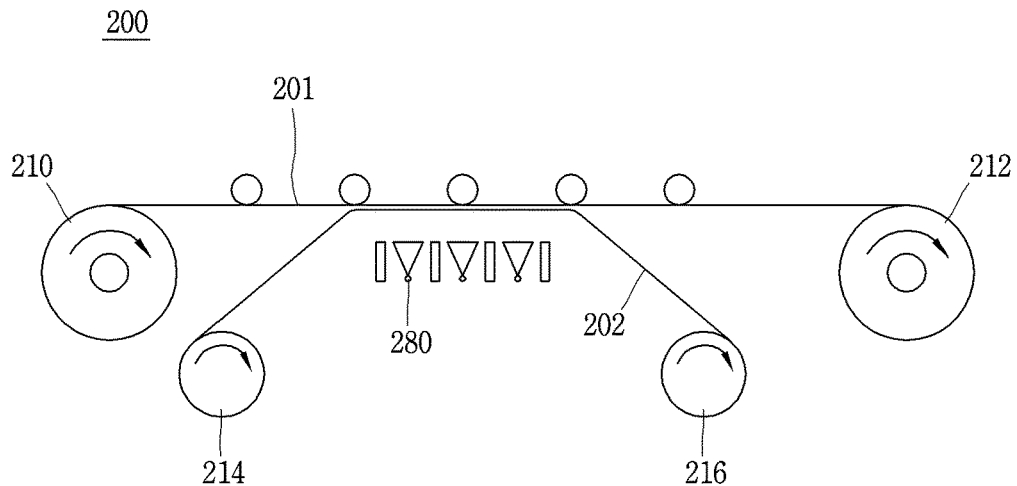
FIG. 3 is a view illustrating the concept of a roll fabrication apparatus for fabricating a lighting apparatus of the present disclosure.

FIG. 3 is a view schematically illustrating the structure of a roll fabrication apparatus 200 for fabricating a lighting apparatus according to the present disclosure.

Here, the roll fabrication apparatus 200 illustrated in FIG. 3 is an apparatus of performing an organic material deposition process for forming an organic light emitting layer and a metal deposition process for forming a second electrode during the fabrication process of the lighting apparatus 100 illustrated in FIG. 2. However, the roll fabrication apparatus of the present disclosure may not be limited to only the process of forming the organic light emitting layer and the second electrode, but may also be applicable to the process of forming the first electrode and/or other structures/elements/layers of the lighting apparatus 100.

In other words, the roll fabrication apparatus of the lighting apparatus 100 illustrated in FIG. 3 may form only a part (for example, the organic light emitting layer and the second electrode) of the configuration of the lighting apparatus 100 using a flexible film as the first substrate as a continuous in-line by a roll-to-roll fabrication process, but also continuously form the entire configuration of the lighting apparatus 100 (including the first electrode and the protective layer, etc.) by a single roll fabrication apparatus.

As illustrated in FIG. 3, the roll fabrication apparatus 200 according to the present disclosure may include a film supply roll 210 configured to wind and supply a film 201 made of a soft material such as plastic, a film collection roll 212 configured to wind and collect the film 201 being transported from the film supply roll 210, a mask supply roll 214 disposed on an entire surface of the film 201 to supply a mask 202 so as to block a partial region of the film 201 and deposit a deposition material only on a preset area, a mask collection roll 216 configured to collect the mask 202 being transported from the mask supply roll 214, and a deposition unit 280 disposed below a transport path of the film 201 to deposit the deposition material on an exposed region of the film 201 exposed through the mask 202.

In general, the mask 202 may be formed of various materials, but according to an example of the present disclosure, the mask 202 may be formed of a film having flexibility such as a polymer to transport the mask 202 in a state that the mask 202 is wound around the mask supply roll 214 and the mask collection roll 216.

Though not shown in the drawing, the film supply roll 210, the film collection roll 212, the mask supply roll 214, and the mask collection roll 216 are respectively coupled to a drive shaft connected to an external drive means, and as the external drive means is driven, a driving force is transmitted to the film supply roll 210, the film collection roll 212, the mask supply roll 214 and the mask collection roll 216 through the drive shaft to rotate the film supply roll 210, the film collection roll 212, the mask supply roll 214, and the mask collection roll 216.

Here, the film 201 and the mask 202 are interlocked to dispose the mask 202 on an entire surface of the film 201 at a preset position.

The deposition unit 280 may be an organic material deposition unit for forming the organic light emitting layer 130 and a metal deposition unit for forming the second electrode 126. The organic material deposition unit and the metal deposition unit are disposed adjacent to each other to continuously deposit the organic light emitting layer 130 and the second electrode 126 on the film 201 being transported. The mask 202 is transported in synchronization with the transport of the film 201 during the deposition of the organic material deposition unit and the metal deposition unit to continuously deposit the organic light emitting layer 130 and the second electrode 126 on a single mask 202.

Furthermore, a laser etching unit is disposed between the organic material deposition unit and the metal deposition unit to etch a part of the organic light emitting layer 130 deposited by the organic material deposition unit to form the contact portion 129 for connecting the second electrode 126 formed thereafter to the second pad 123b.

Figure 4:
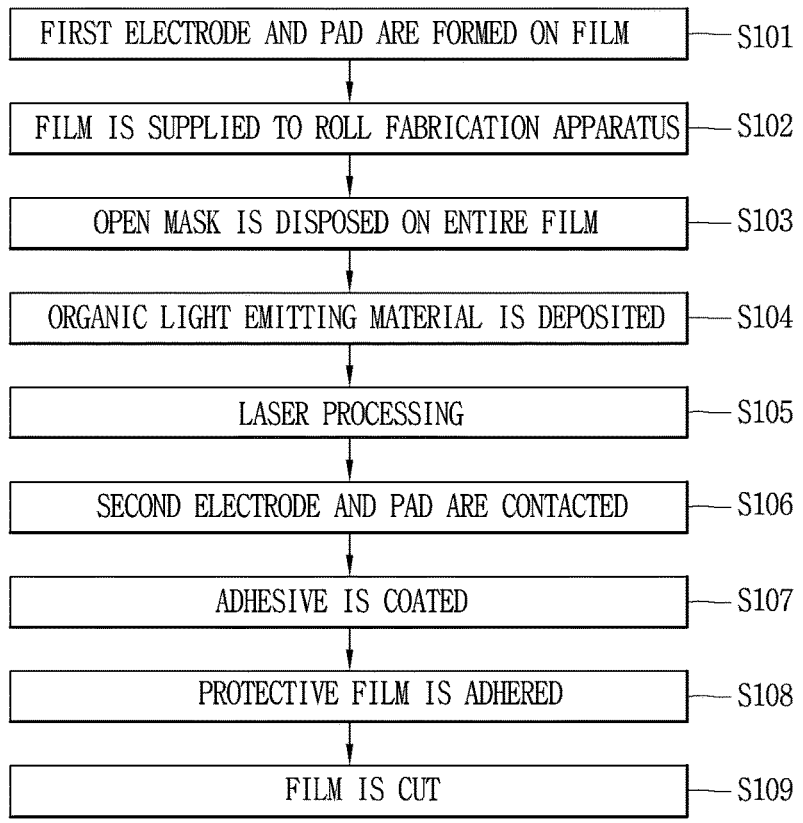
FIG. 4 is a flow chart schematically illustrating a fabrication method of a lighting apparatus according to the present disclosure.

FIG. 4 is a flow chart schematically illustrating a method of fabricating a lighting apparatus according to the present disclosure. Here, the illustrated method of fabricating a lighting device is a fabrication method in case where a plastic film having flexibility is used as the first substrate. However, such a fabrication method illustrates an example of a method of fabricating the lighting apparatus of the present disclosure, and the lighting apparatus of the present disclosure is not made only by the illustrated fabrication method.

As illustrated in FIG. 4, first, a tin oxide-based transparent conductor, a zinc oxide-based transparent conductor or a transparent conductive polymer is deposited and etched on a film such as a plastic to form the first electrode 124 and the pads 123a, 123b (S101). Here, the first electrode 124 and the pads 123a, 123b may be formed by a fabrication apparatus other than the roll fabrication apparatus illustrated in FIG. 3, but may also be formed by the roll fabrication apparatus 200 in line with the organic material deposition unit and the metal deposition unit.

Here, the film is a flexible film such as plastic, and a plurality of lighting apparatuses 100 are formed on the film by a plurality of processes, and the film is cut and divided into individual lighting apparatuses 100.

Figure 5A:
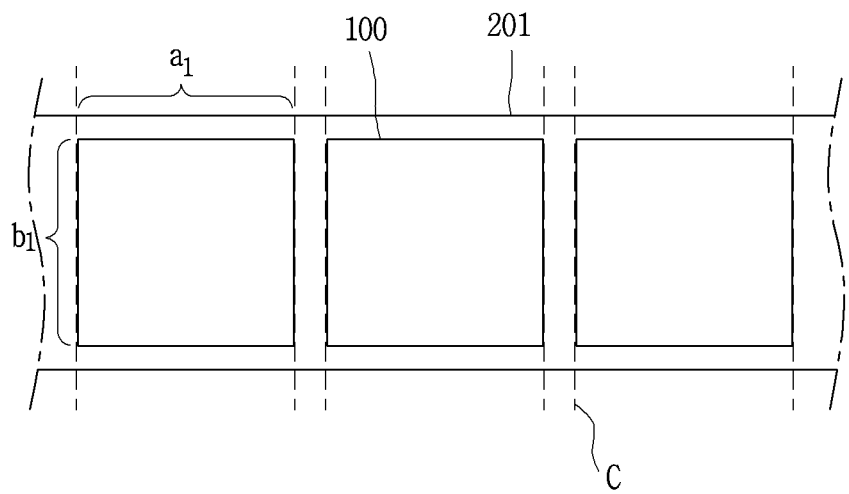
FIGS. 5A and 5B are views schematically illustrating a film on which a lighting apparatus of the present disclosure is fabricated.
Figure 5B:
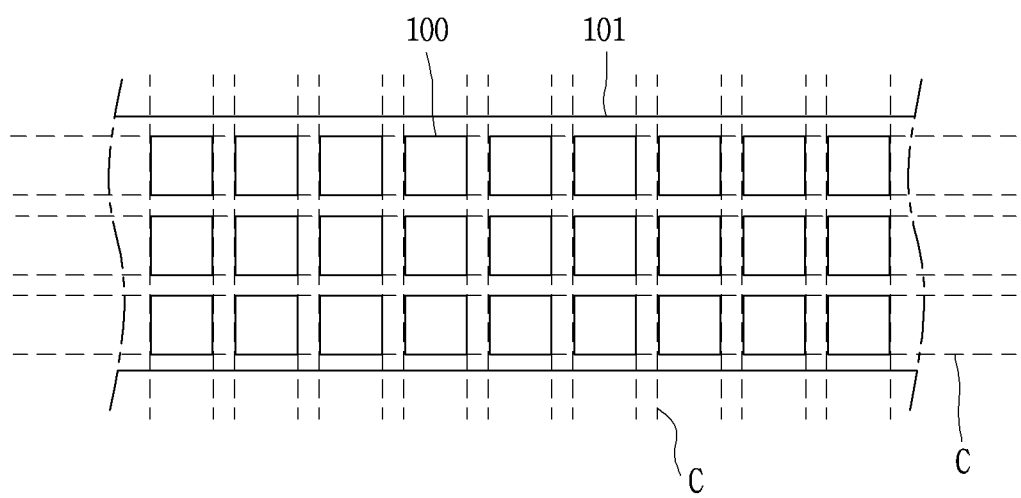

FIGS. 5A and 5B are views illustrating a film on which a process is carried out by a roll fabrication apparatus having a structure illustrated in FIG. 3.

As illustrated in FIG. 5A, a plurality of lighting apparatuses 100 are arranged in a line along a length direction of the film 201. All the processes illustrated in FIG. 4 are carried out on the film 201, and subsequent to the completion of all the processes, the film 201 is cut and divided into a plurality of lighting apparatuses 100.

Here, a cutting line (C) is formed in a width direction of the film 201. The cutting line (C) is formed along the sides of the lighting apparatuses 100 arranged in a length direction of the film 201, and the lighting apparatuses 100 are divided into each lighting apparatus along the cutting line (C) at the completion of the lighting apparatuses 100. Each lighting apparatus 100 includes a horizontal length (a1) in the length direction and a vertical length (b1) in the width direction.

As illustrated in FIG. 5B, a plurality of lighting apparatuses 100 may be arranged in a plurality of rows along a length direction of the film 201, and n×m lighting apparatuses 100 may be formed on the film 201. Furthermore, the cut line (C) is arranged in a length direction and a width direction of the film 201 on the film 201 having such a structure, and the completed lighting apparatuses 100 are divided into each unit.

Referring to FIG. 4 again, the film 201 on which the first electrode 124 and the pads 123a, 123b are formed is supplied to the roll fabrication apparatus 200 illustrated in FIG. 3 (S102), and the mask 202 is disposed on an entire surface of the film 201 (S103).

Here, the mask 202 is formed in a film shape as illustrated in FIG. 3, and transported in interlock with the film 201 by the mask supply roll 214 and the mask collection roll 216 and thus disposed on an entire surface of the film 201.

In addition, the mask 202 may be provided separately and disposed on an entire surface of the film 201 without being transported by the mask supply roll 214 and the mask collection roll 216. Here, the mask 202 may be formed of metal.

Figure 6:
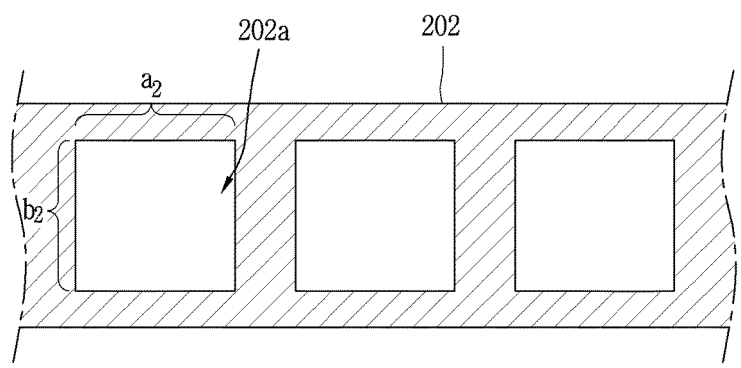
FIG. 6 is a view illustrating a mask according to the present disclosure.

FIG. 6 is a plan view illustrating the structure of the mask 202 according to the present disclosure. Here, the mask 202 is a mask 202 corresponding to the film 201 illustrated in FIG. 5A, and an open region 202a is formed in a region corresponding to the lighting apparatus 100 disposed along a length direction of the film 201, and thus, when the film 201 and the mask 202 are transported on the roll fabrication apparatus 200 illustrated in FIG. 3 and disposed on an entire surface of the deposition unit 280, it is aligned with the lighting apparatus 100 of the film 201 in the open region 202a of the mask 202.

Though not shown in the drawing, the mask 202 corresponding to the film 201 having a structure illustrated in FIG. 5B may also be configured in such a manner that the open region 202a is formed in a region corresponding to the lighting apparatus 100.

As illustrated in FIG. 6, the mask 202 is formed with a plurality of open regions 202a along a length direction thereof. The open region 202a is disposed on an entire surface of the lighting apparatus 100 of the film 201 during the deposition process. Here, a horizontal length (a2) (i.e., in a length direction) and a vertical length (b2) (i.e., in a width direction) of the open area 202a of the mask 202 are respectively set to be less than a horizontal length (a1) and a vertical length (b1) (FIG. 5A) of the lighting apparatus 100 formed on the film 201 (a1>a2, b1>b2). Therefore, when the mask 202 is disposed and aligned on an entire surface of the film 201, a partial region of four edges of the lighting apparatus 100 formed on the film 201 is blocked by the mask 202.

Referring again to FIG. 4 again, an organic light emitting material is deposited on the substrate 110 in a state that a partial region of the film 201, namely, four edge regions of the lighting apparatus 100 including the first and second outer portions (NA1, NA2), is blocked by the mask 202 to form an organic luminescent layer 130 in a partial region of the outer portions (NA1, NA2) and the light portion (EA) of the lighting apparatus 100 (S103). Accordingly, the organic light emitting layer 130 is deposited only in a region corresponding to the open region 202a of the mask 202 but not deposited in a region blocked by the mask 202, and thus the organic light emitting layer 130 is not deposited on the first and second pads 123a, 123b disposed on the first and second outer portions (NA1, NA2) corresponding to both edge regions of the film 202, and the first and second pads 123a,123b are exposed to the outside.

Subsequently, a partial region of the organic light emitting layer 130 is processed (etched) by a laser to form the contact portion 129 on the organic light emitting portion 130 (S105).

Then, a metal is deposited in a state that the mask 202 is reused to block a partial region of the film 201 so as to form the second electrode 126 (S106). Here, and thus the second electrode 126 is also formed on the contact portion 129 formed on the organic light emitting layer 130, the second electrode 126 is thus electrically connected to the second pad 123b through the contact portion 130.

On the other hand, the mask 202 used to form the second electrode 126 is the same mask as the mask 202 used to form the organic light emitting layer 130. In other words, an organic light emitting material and a metal are deposited using a single mask 202 to form the organic light emitting layer 130 and the second electrode 126. Accordingly, the second electrode 126 is deposited only in a region corresponding to the open region 202a of the mask 202 but not deposited in a region blocked by the mask 202, and thus the second electrode 126 is not formed on the second pad 123b disposed on the second outer portion (NA1, NA2) corresponding to both edge regions of the film 202, and the second electrode 126 is not electrically connected to the second pad 123b.

However, the contact part 129 on which a partial region of the organic light emitting layer 130 is etched is formed on the organic light emitting layer 130, and the second electrode 126 is also formed inside the contact part 129, and thus the second electrode 126 is electrically connected to the second pad 123b through the contact portion 129.

Subsequently, an adhesive 118 is coated on the film 201 and a protective film is adhered thereto to form a plurality of lighting apparatuses 100 on the film 201 (S107, S108). Here, the protective film may be formed of various materials. For example, the protective film may be formed of a polymer such as PET (polyethyleneterephtalate) or a thin metal foil. Furthermore, in case of using a sheet fabrication apparatus other than a roll fabrication apparatus, a non-flexible material such as glass may be used.

Then, the lighting apparatuses 100 may be separated by cutting the film 201 to complete each lighting apparatus 100. Here, as illustrated in FIGS. 5A and 5B, the cutting of the film 201 is carried out along a cutting line(s)"c" formed along a length direction and/or a width direction of the film 201.

As described above, according to the present disclosure, the organic light emitting layer 130 and the second electrode 126 are formed using a single mask. In this case, the organic light emitting layer 130 and the second electrode 126 are formed in the same region, the organic light emitting layer 130 is disposed between the second electrode 126 and the second pad 123*b*. Therefore, when the organic light emitting layer 130 and the second electrode 126 are formed using a single mask as in the present disclosure, the second electrode 126 and the second pad 123*b* are formed by interposing the organic light emitting layer 130 therebetween, and thus, the second electrode 126 and the second pad 123*b* are electrically insulated by the organic light emitting layer 130. In order to electrically connect the second electrode 126 to the second pad 123*b*, an area of the organic light emitting layer 130 may be formed to be smaller than that of the second electrode 126 using two masks having different open region areas, and the second electrode 126 may be extended to an outer region of the organic light emitting layer 130 and disposed on an upper surface of the second pad 123*b*, thereby allowing the second electrode 126 in contact with the second pad 123*b*. However, in this case, a mask to be used may be added to complicate the structure of facilities (for example, the mask supply roll 214 and the mask collection roll 216), thereby increasing fabrication cost.

According to the present disclosure, the organic light emitting layer 130 and the second electrode 126 are formed using a single mask, and a part of the organic light emitting layer 130 is removed to form the contact portion 129 so as to electrically connect the second electrode 126 to the second pad 123*b*, and the second electrode 126 and the second pad 123*b* are electrically connected to each other through the contact portion 129.

Hereinafter, an example fabrication method of a lighting apparatus according to the present disclosure will be described in detail. The lighting apparatus 100 may be a lighting apparatus using a flexible plastic film or a lighting apparatus using a non-flexible rigid glass.

FIGS. 7A through 7D are cross-sectional views illustrating an example fabrication method of the lighting apparatus 100 according to the present disclosure, and FIGS. 8A through 8D are plan views illustrating a practical fabrication method of the lighting apparatus 100 according to the present disclosure. Here, the fabrication process of the lighting apparatus 100 may be carried out on a plastic film on which a continuous process is carried out by a roll fabrication apparatus, but the present disclosure may not be limited thereto, but may be carried out on a glass mother substrate having a large area. In particular, According to the present disclosure, the lighting apparatus 100 is fabricated using a single mask. Furthermore, for the following process, a fabrication process of a plurality of lighting apparatuses is carried out in the film unit or mother substrate unit, but for the following description, it will be described in one lighting apparatus unit.

Figure 7A:
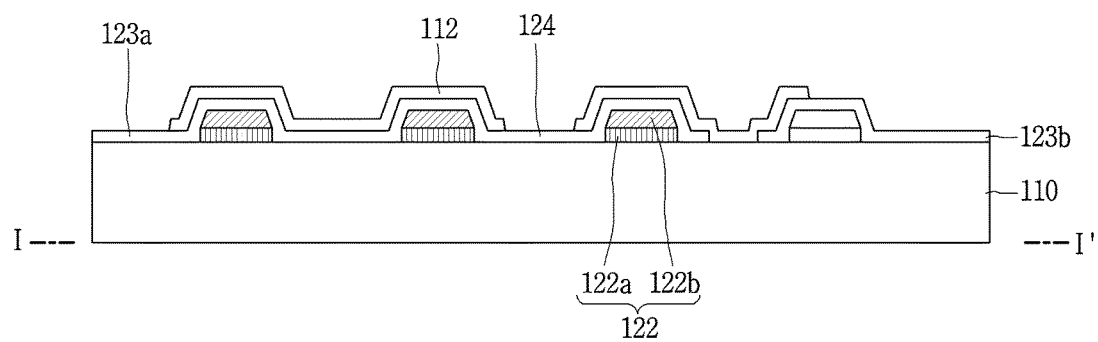
FIGS. 7A through 7D are cross-sectional views illustrating a fabrication method of a lighting apparatus according to a first embodiment of the present disclosure.
Figure 8A:
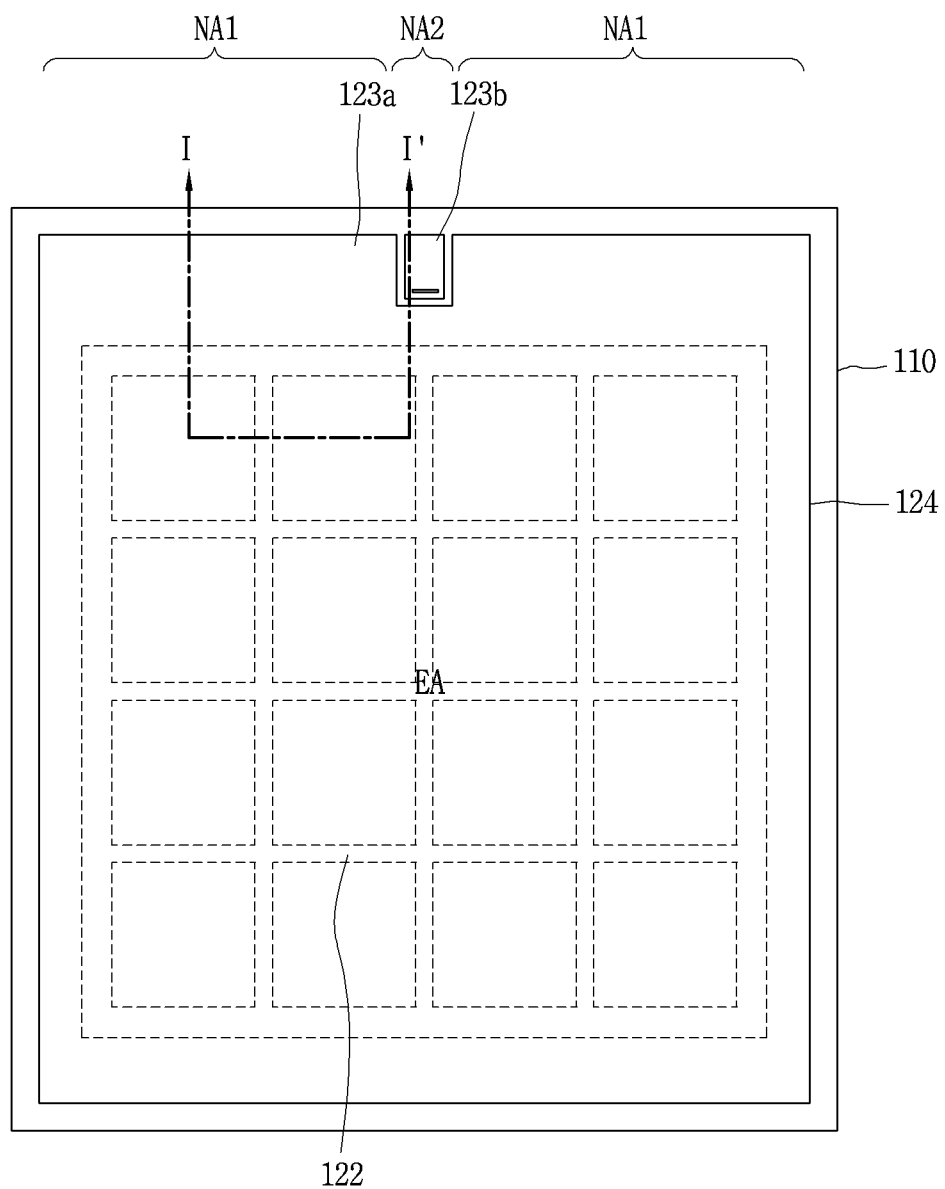
FIGS. 8A through 8D are plan views illustrating a fabrication method of a lighting apparatus according to a first embodiment of the present disclosure.

First, as illustrated in FIGS. 7A and 8A, a metal such as Al, Au, Cu, Ti, W, Mo or an alloy thereof is deposited and etched on a first substrate 110 formed of a soft material such as plastic or glass or the like to include a lighting portion (EA) and outer portions (NA1, NA2) so as to form an auxiliary electrode 122 configured with a single layer or a plurality of layers on the lighting portion (EA) and the outer portions (NA1, NA2). Here, the auxiliary electrode 122 is disposed in a matrix shape in a horizontal direction and a vertical direction in a band shape set on an entire region of the lighting portion (EA) and a partial region of the outer area parts (NA1, NA2), but the auxiliary electrode 122 may be disposed in a mesh shape, a hexagonal shape, an octagonal shape or a circular shape.

Then, a transparent conductive material such as ITO or IZO is deposited and etched over an entire surface of the first substrate 110 to form a first electrode 124 disposed on the auxiliary electrode 122 of the lighting portion (EA) and the first outer portion (NA1), and form a first pad 123*a* and a second pad 123*b* on the first outer portion (NA1) and the second outer portion (NA2), respectively. For example, the first outer portion (NA1) and the second outer portion (NA2) may be referred to with respect to their correspondence to the first pad 123*a* and the second pad 123*b*, respectively. Subsequently, an insulating material such as SiNx or SiOx is deposited and etched on the lighting portion (EA) and the first and second outer portions (NA1, NA2) to form a protective layer 112.

Here, the auxiliary electrode 122, first electrode 124, connection pattern 129, and first and second pads 123*a*, 123*b* may be formed by a continuous photo process on a roll fabrication apparatus or may be formed by a typical sheet-type photo process.

Figure 7B:
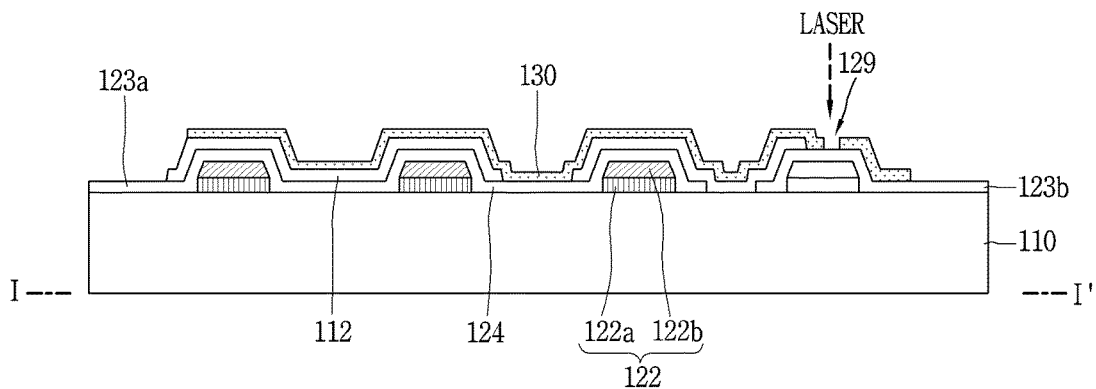
Figure 8B:
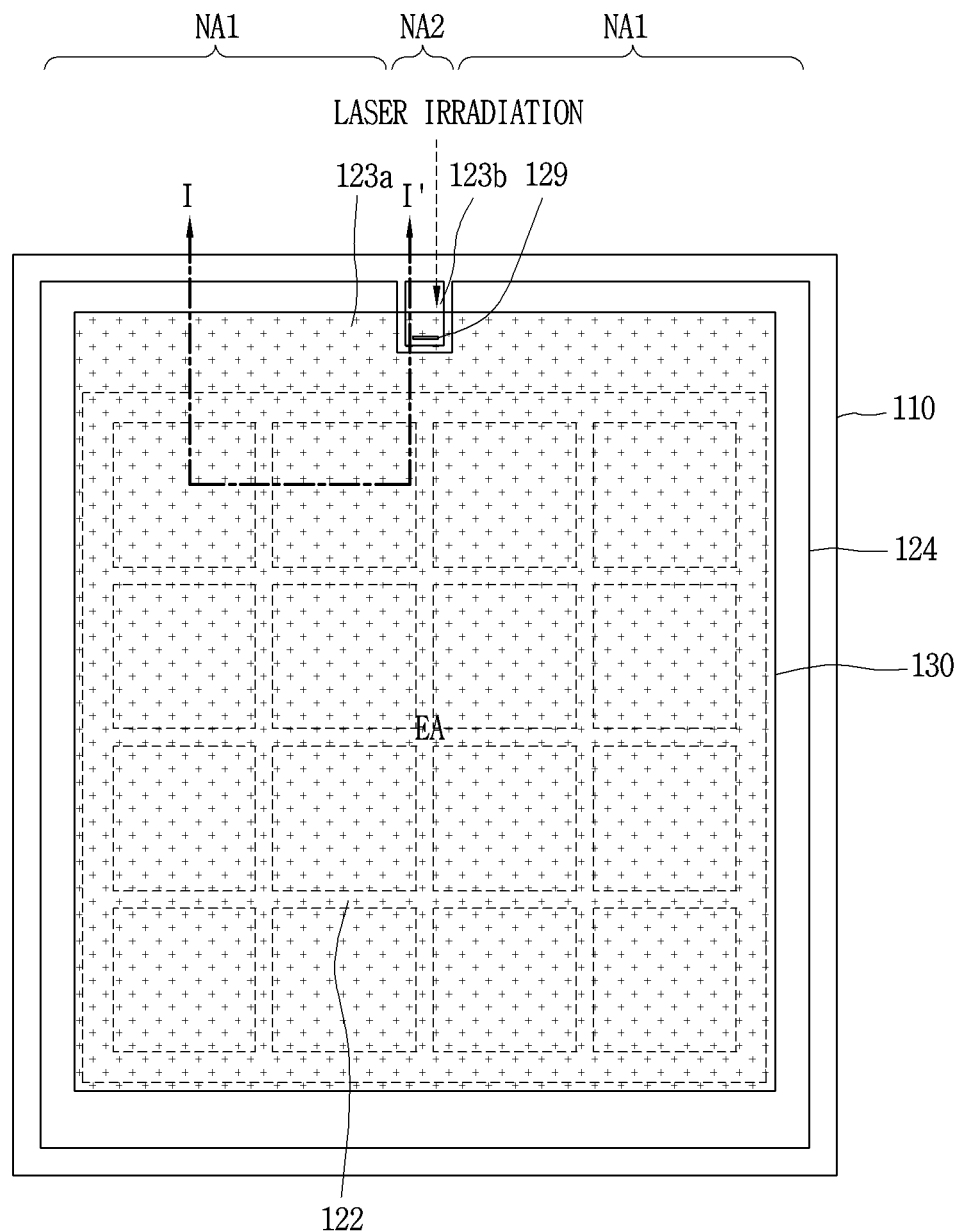

Then, as illustrated in FIGS. 7B and 8B, an organic light emitting material is deposited on a partial region of the lighting portion (EA) and the first and second outer portions (NA1, NA2) of the first substrate 110 to form an organic light emitting layer 130. Here, the formation of the organic light emitting layer 130 may be carried out by a roll fabrication apparatus having the structure illustrated in FIG. 3. In other words, in a state that a mask 202 illustrated in FIG. 6 is disposed on an entire surface of the film 201 of the roll fabrication apparatus to open a predetermined region of the film 201, an organic light emitting material may be deposited while synchronously transporting the film 201 and the mask 202 to form the organic light emitting layer 130. Here, four edge regions of the first substrate 110 are blocked by the mask 202, and thus the organic light emitting layer 130 is not formed in the four edge regions of the first substrate 110, and the first pad 123*a* and the second pad 123*b* are not completely overlapped/hidden by the organic light emitting layer 130 but exposed to the outside.

Furthermore, the formation of the organic light emitting layer 130 may be formed by disposing a mask on a mother substrate formed with a plurality of lighting apparatuses, and then depositing an organic light emitting material.

Then, a laser is irradiated on the organic light emitting layer 130 over the second outer portion (NA2) to etch the organic light emitting layer 130 in the relevant region so as to form a contact portion 129 on the second light emitting layer 130 in which a portion of the second pad 123*b* that is initially overlapped by the organic light emitting layer 130 is exposed to the outside. Here, the contact portion 129 may be formed in a thin band shape having a predetermined length on the second outer portion (NA2) at an upper portion of the lighting apparatus 100, but the contact portion 129 is not limited to a specific shape or area, and may be configured in various shapes and areas. For example, the contact portion 129 may be configured in various shapes and areas such as a circular shape or a polygonal shape.

Figure 7C:
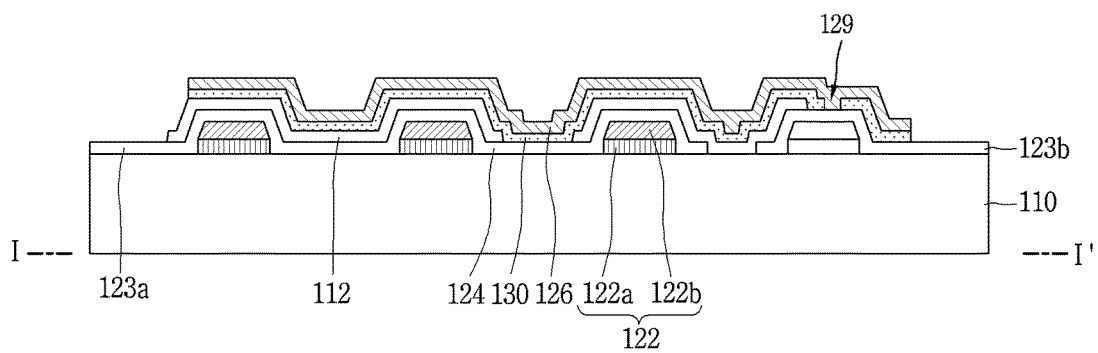
Figure 8C:
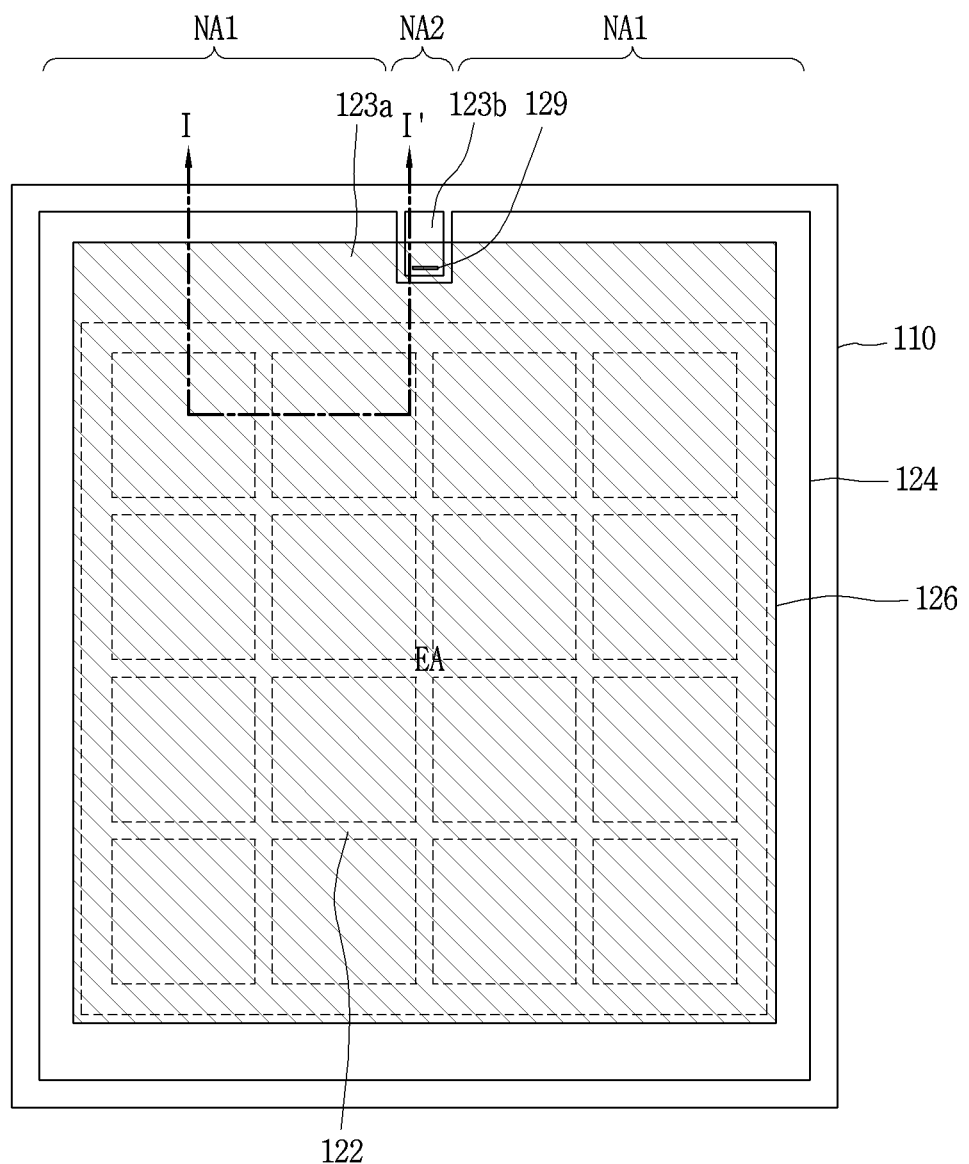

Subsequently, as illustrated in FIGS. 7C and 8C, a metal such as Ca, Ba, Mg, Al or Ag is deposited on the organic light emitting layer 130 to form a second electrode 126. In this case, the second electrode 126 may also be formed using a roll fabrication apparatus as illustrated in FIG. 3 or formed by a typical sheet type deposition apparatus, and the mask used in forming the organic light emitting layer 130 may be used again to deposit a metal.

Accordingly, the second electrode 126 is formed only in a region formed with the organic light emitting layer 130, and thus the metal is not deposited on four edge regions of the substrate 110 blocked by the mask. Therefore, the second electrode 126 is not formed on the first pad 123*a* and the second pad 123*b* of the first and second outer portions (NA1, NA2) and the first pad 123*a* and the second pad 123*b* are exposed to the outside. In other words, the organic light emitting layer 130 and the second electrode 126 are not all disposed in the four edge regions of the substrate 110, and thus the organic light emitting layer 130 and the second electrode 126 are not also disposed on the first pad 123*a* and the second pad 123*b* of the first and second outer portions (NA1, NA2) and the first pad 123*a* and the second pad 122*b* are exposed to the outside and electrically connected to an external signal source.

Furthermore, the second electrode 126 is also formed inside the contact portion 129 formed on the organic light emitting layer 130, and thus the second electrode 126 is electrically connected to the second pad 123*b* through the contact portion 129.

Accordingly, according to the present disclosure, in order to connect the organic light emitting layer 130 and the second electrode 126 while at the same time forming the organic light emitting layer 130 and the second electrode 126 by a single mask process, a part of the light emitting layer 130 is etched by a laser to form the contact portion 129.

Figure 7D:
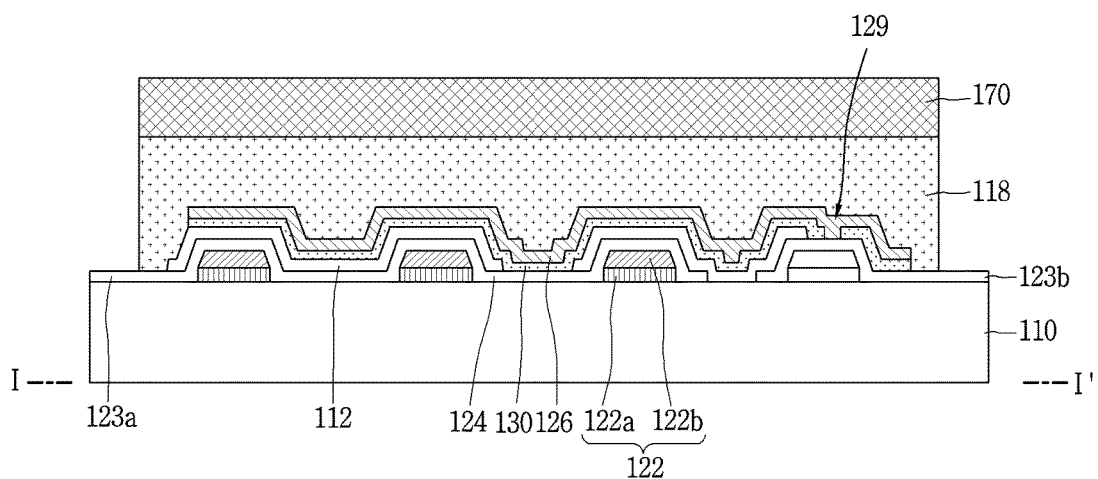
Figure 8D:
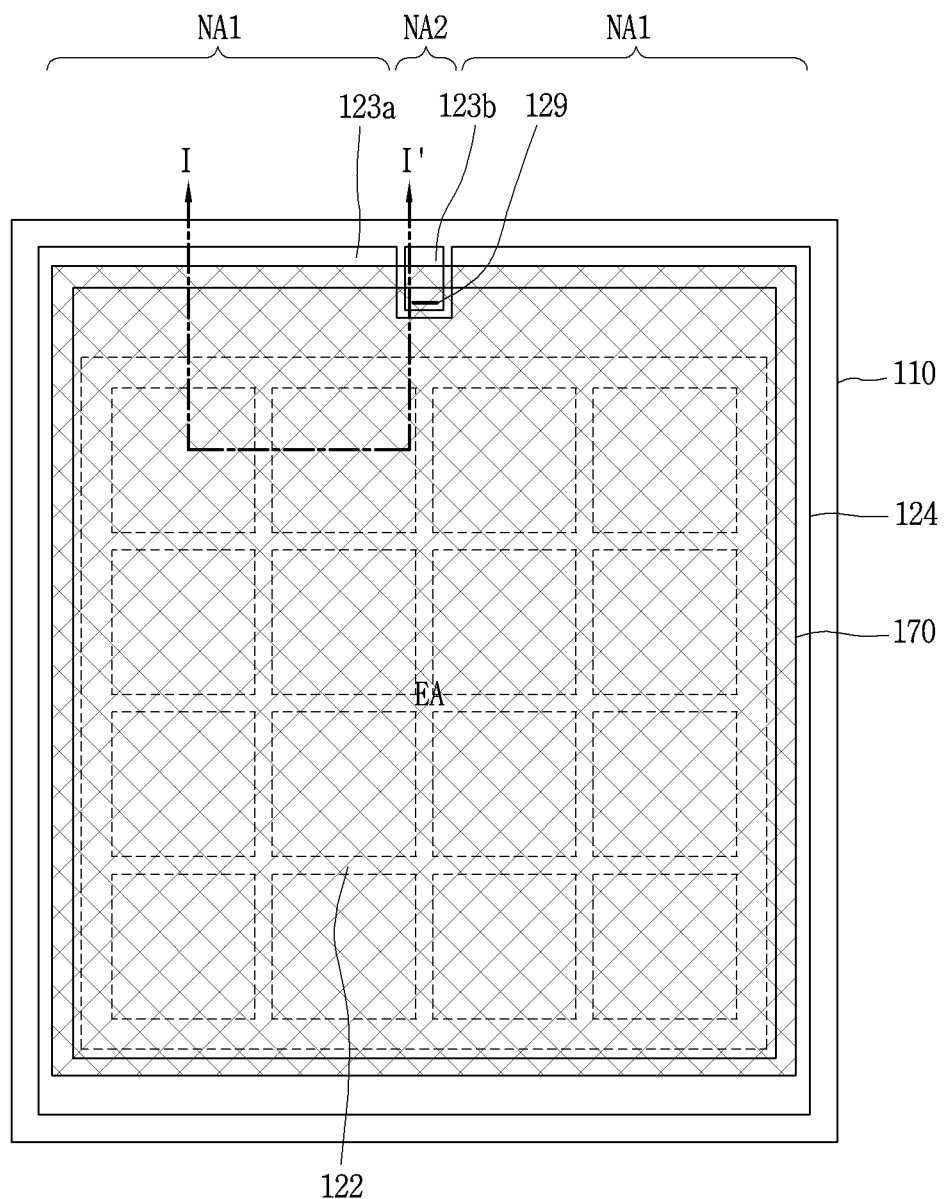

Then, as illustrated in FIGS. 7D and 8D, an adhesive 118 formed of a photocurable adhesive material or thermosetting adhesive material is coated on the first substrate 110, and a second substrate 170 is placed thereon, and then the second substrate 170 is adhered thereto by curing the adhesive 118, and then the first substrate 110 and the second substrate 170 adhered to each other are cut to separate a completed lighting apparatus 100, thereby completing each lighting apparatus 100. For the second substrate 170, a polymer film such as PET, a thin metal foil, glass, or the like may be used.

Here, as illustrated in FIGS. 5A and 5B, the cutting of the first substrate 110 and the second substrate 170 is carried out along a cutting line (C).

At this time, the cutting of the first substrate 110 and the second substrate 170 may be carried out with various methods. For example, the first substrate 110 and the second substrate 170 may be cut by a laser such as an Nd-YAG laser or a CO2 laser or the first substrate 110 and the second substrate 170 may be cut using a mechanical cutting tool.

Figure 9A:
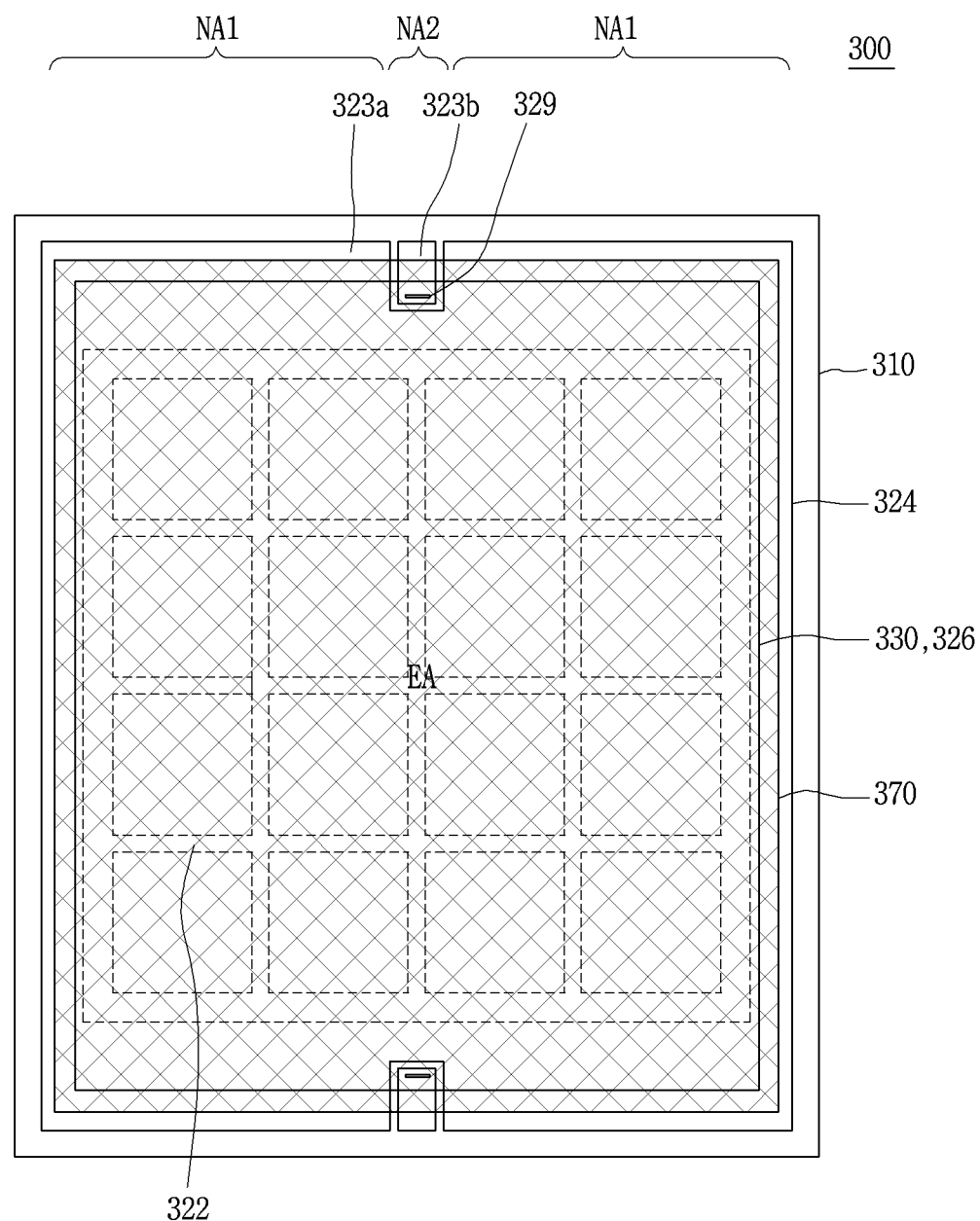
FIGS. 9A and 9B are plan views illustrating the structure of a lighting apparatus according to a second embodiment of the present disclosure.
Figure 9B:
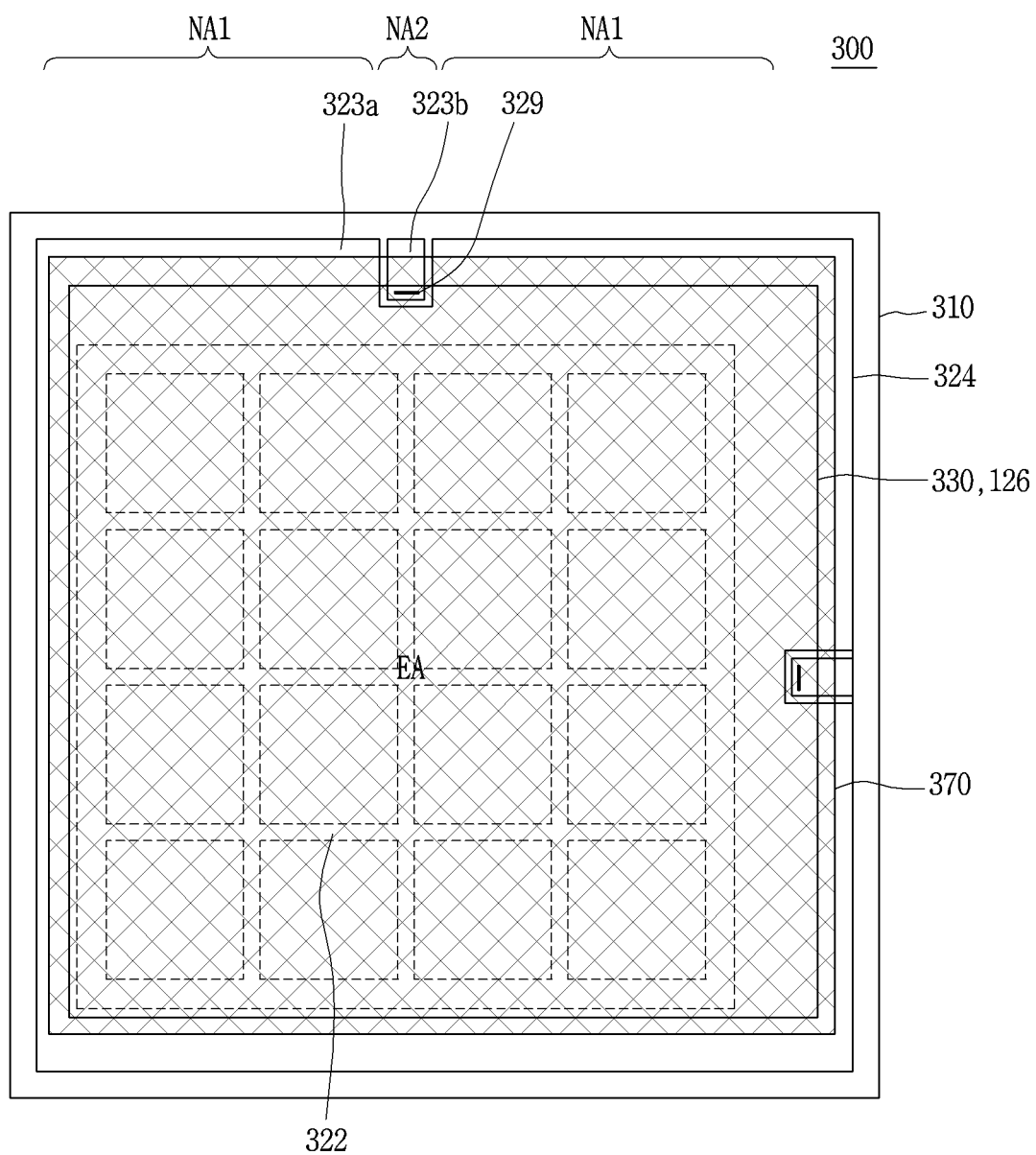

FIGS. 9A and 9B are plan views illustrating a lighting apparatus 300 according to a second embodiment of the present disclosure.

As illustrated in FIG. 9A, the lighting apparatus 300 of this embodiment is configured with a first substrate 310 including a lighting portion (EA) for emitting actual light to output the light to the outside, and outer portions (NA1, NA2) at an outside thereof. The first substrate 310 is formed of plastic or glass having flexibility, and a first electrode 324 and a second electrode 326 are disposed on the first substrate 310, and an organic light emitting layer 330 is disposed between the first electrode 324 and the second electrode 326. In addition, a matrix-shaped auxiliary electrode 322 is disposed in a partial region of the lighting portion (EA) and the outer portions (NA1, NA2).

A first outer portion (NA1) and a second outer portion (NA2) are disposed on an upper side and a lower side of the first substrate 310, respectively, and a first pad 323*a* is provided on the first outer portion (NA1) and a second pad 323*b* is disposed on the second outer portion (NA2).

The organic light emitting layer 330 and the second electrode 326 are formed using the same mask, and thus the organic light emitting layer 330 and the second electrode 326 are formed in the same area on the first substrate 310. Accordingly, the organic light emitting layer 330 is disposed between the second pad 323*b* formed integrally with the first electrode 324 and the second electrode 326, and thus the second electrode 326 is electrically disconnected from the second pad 323*b* by the organic light emitting layer 330. A contact portion 329 from which a part of the organic light emitting layer 330 of the second outer portion (NA2) is removed by a laser or the like is formed, and the second electrode 326 is electrically connected to the second pad 322 through the contact portion 329, and a signal is applied to the second electrode 326 through the second pad 323*b*.

In particular, according to the lighting apparatus of this embodiment, the first pad 323*a* and the second pad 323*b* are formed on an upper and a lower edge regions of the first substrate 310, respectively, and a signal is applied from an upper side and a lower side of the lighting apparatus 300, and thus the signal may be quickly applied to the entire lighting apparatus 300 as compared with the lighting apparatus of the first embodiment illustrated in FIG. 1 in which only one first pad 323*a* and second pad 323*b* is formed, thereby allowing a quick drive of the lighting apparatus 300.

In particular, it may be possible to prevent quality deterioration due to a signal delay during the fabrication of the lighting apparatus 300 having a large area.

As illustrated in FIG. 9B, according to the lighting apparatus 300 of this embodiment, the first outer portion (NA1) and the second outer portion (NA2) may be disposed on an upper side and a rightside (or a leftside) of the first substrate 310. Even in the lighting apparatus 300 with the foregoing structure, two first pads 323*a* and second pads 323*b* are arranged in the lighting apparatus 300, and thus a signal may be quickly applied to the lighting apparatus 300, thereby quickly driving the lighting apparatus 300 with no signal delay.

On the drawing, the first outer portion (NA1) and the second outer portion (NA2) are formed in two regions on the first substrate 310, but the first outer portion (NA1) and the second outer portion (NA2) may be formed in three or four regions on the first substrate 310, and thus also formed with three of four first pads 323*a* and second pads 323*b*.

Figure 10:
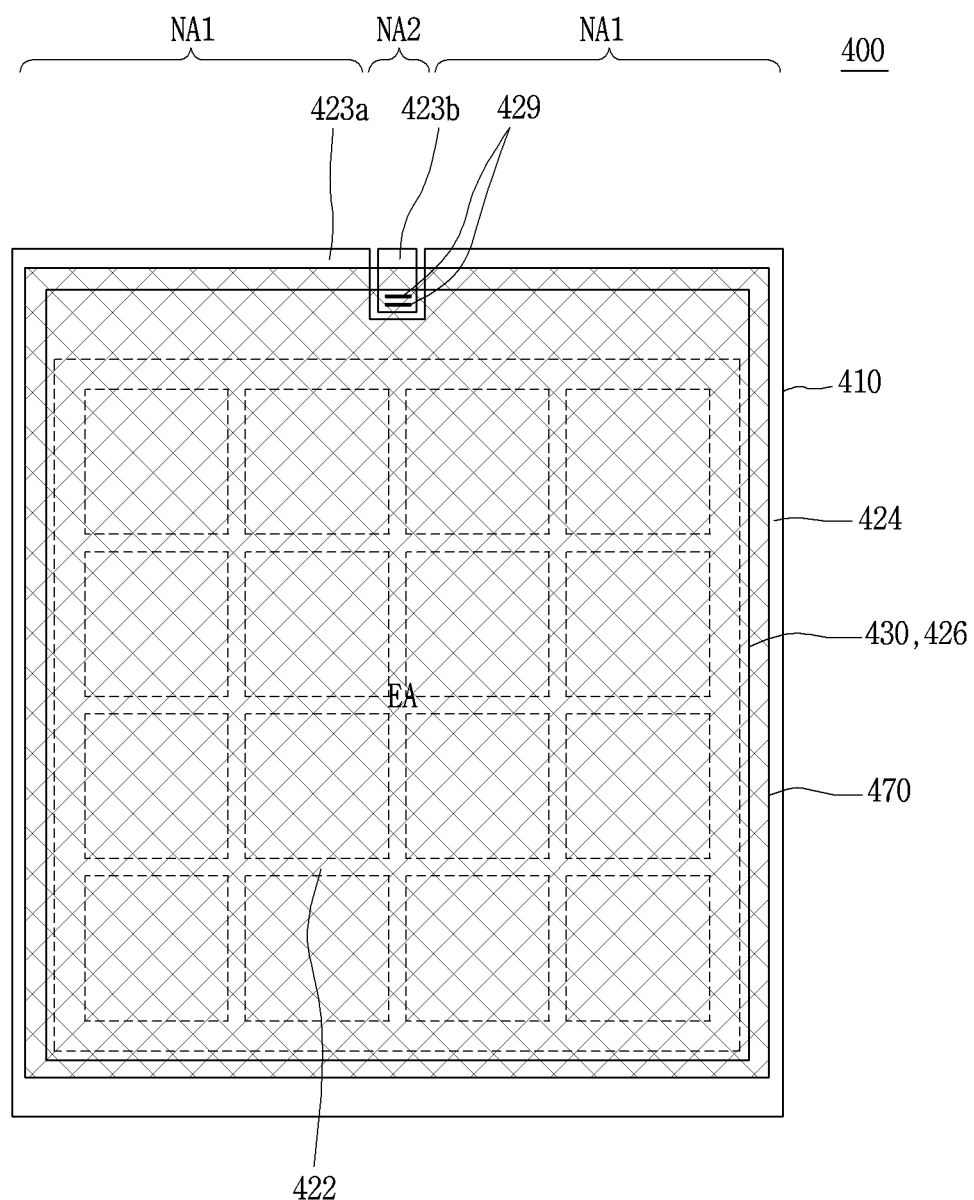
FIG. 10 is a plan view illustrating the structure of a lighting apparatus according to a third embodiment of the present disclosure.

FIG. 10 is a plan view illustrating the structure of a lighting apparatus 400 according to a third embodiment of the present disclosure.

As illustrated in FIG. 10, according to the lighting apparatus 400 of this structure, one first outer portion (NA1) and second outer portion (NA2) is disposed on an upper side of the first substrate 400. Furthermore, two contact portions 429 are formed on the second pad 423*b* disposed on the second outer portion (NA2), and thus the second electrode 426 and the second pad 423*b* are connected to each other through the two contact portions 429. As described above, this embodiment may be formed with two contact portions 429, thereby preventing a signal delay due to a contact resistance as compared with the structure in which one contact portion is formed.

On the drawing, two contact portions 429 may be formed, but three or more contact portions 429 may also be formed. Furthermore, as illustrated in FIGS. 9A and 9B, two or more second pads 423*b* may be formed on the first substrate 410, and a plurality of contact portions 429 may be formed on each of the second pads 423*b*.

As described above, according to the present disclosure, a metal or an organic light emitting material may be deposited on a substrate using a single mask to form a lighting apparatus. In particular, according to the present disclosure, a part of the organic light emitting layer 130 may be etched with a laser to electrically connect the second electrode 126 to the second pad 123*b*, thereby not requiring the use of an additional mask.

Various modified examples of the present disclosure or structures that can be easily contrived based on the present disclosure should be included in the scope of the present disclosure. Accordingly, the right scope of the present disclosure should not be determined by the foregoing detailed description, but should be determined by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lighting apparatus, comprising:
   a first substrate comprising a lighting portion, a first outer portion and a second outer portion;
   an organic light emitting device configured with a first electrode, an organic light emitting layer, and a second electrode disposed in the lighting portion and a partial region of at least one of the first outer portion or the second outer portion of the substrate;
   at least one first pad disposed on the first outer portion and electrically connected to the first electrode, and at least one second pad disposed on the second outer portion, the second pad being formed on a same layer as the first pad and electrically connected to the second electrode through a contact portion formed in the organic light emitting layer; and
   an auxiliary electrode disposed in the lighting portion and the first and second outer portions of the first substrate, the auxiliary electrode being connected to the first electrode.

2. The lighting apparatus of claim 1, wherein the auxiliary electrode is disposed in at least one of a matrix shape, a mesh shape, an octagonal shape, a hexagonal shape, and a circular shape within the lighting portion with a predetermined width.

3. The lighting apparatus of claim 1, wherein the first pad and the second pad are disposed in two or more edge regions of the first substrate.

4. The lighting apparatus of claim 1, wherein the first pad and the second pad are disposed in one edge region of the first substrate.

5. The lighting apparatus of claim 1, wherein the contact portion is formed in a band shape.

6. The lighting apparatus of claim 1, wherein the contact portion is formed in a hole shape.

7. The lighting apparatus of claim 1, wherein the first substrate is formed of a flexible film.

8. The lighting apparatus of claim 1, wherein the first substrate is formed of glass.

9. The lighting apparatus of claim 1, wherein the organic light emitting layer and the second electrode have a same surface area, and the organic light emitting layer is disposed between the second electrode and the second pad.

10. The lighting apparatus of claim 9, wherein the contact portion is formed in a region where a portion of the organic light emitting layer that overlaps with the second pad is removed by a laser.

11. The lighting apparatus of claim 1, further comprising:
    a second substrate adhered to the first substrate by an adhesive.

12. The lighting apparatus of claim 11, wherein the second substrate is formed of any one of materials selected from the group consisting of a polymer film, a metal foil and glass.

* * * * *